May 16, 1950 R. M. WILMOTTE 2,508,321

METHOD AND MEANS OF CONTROLLING ELECTRONIC HEATING

Filed Sept. 5, 1945 3 Sheets-Sheet 1

Inventor

Raymond M. Wilmotte

METHOD AND MEANS OF CONTROLLING ELECTRONIC HEATING

Filed Sept. 5, 1945 3 Sheets-Sheet 2

Inventor
Raymond M. Wilmotte

METHOD AND MEANS OF CONTROLLING ELECTRONIC HEATING

Filed Sept. 5, 1945 3 Sheets-Sheet 3

Inventor

Raymond M. Wilmotte

Patented May 16, 1950

2,508,321

UNITED STATES PATENT OFFICE 2,508,321

METHOD AND MEANS OF CONTROLLING ELECTRONIC HEATING

Raymond M. Wilmotte, Washington, D. C.

Application September 5, 1945, Serial No. 614,554

32 Claims. (Cl. 219—47)

This invention relates to electronic heating control apparatus and particularly to means for tuning a variable load to the generator frequency.

In electronic heating the load may change its reactance characteristics during the heating cycle and the reactance of successive loads may differ considerably. These variations make it difficult to maintain the load circuit resonant at the proper frequency and result in inefficient operation of the generator, as well as erratic heating.

It is an object of my invention to overcome the difficulties of maintaining the load circuit tuned to the generator and to more efficiently utilize the output of the generator.

My invention will be fully understood from the following description and drawings in which.

Figure 1:
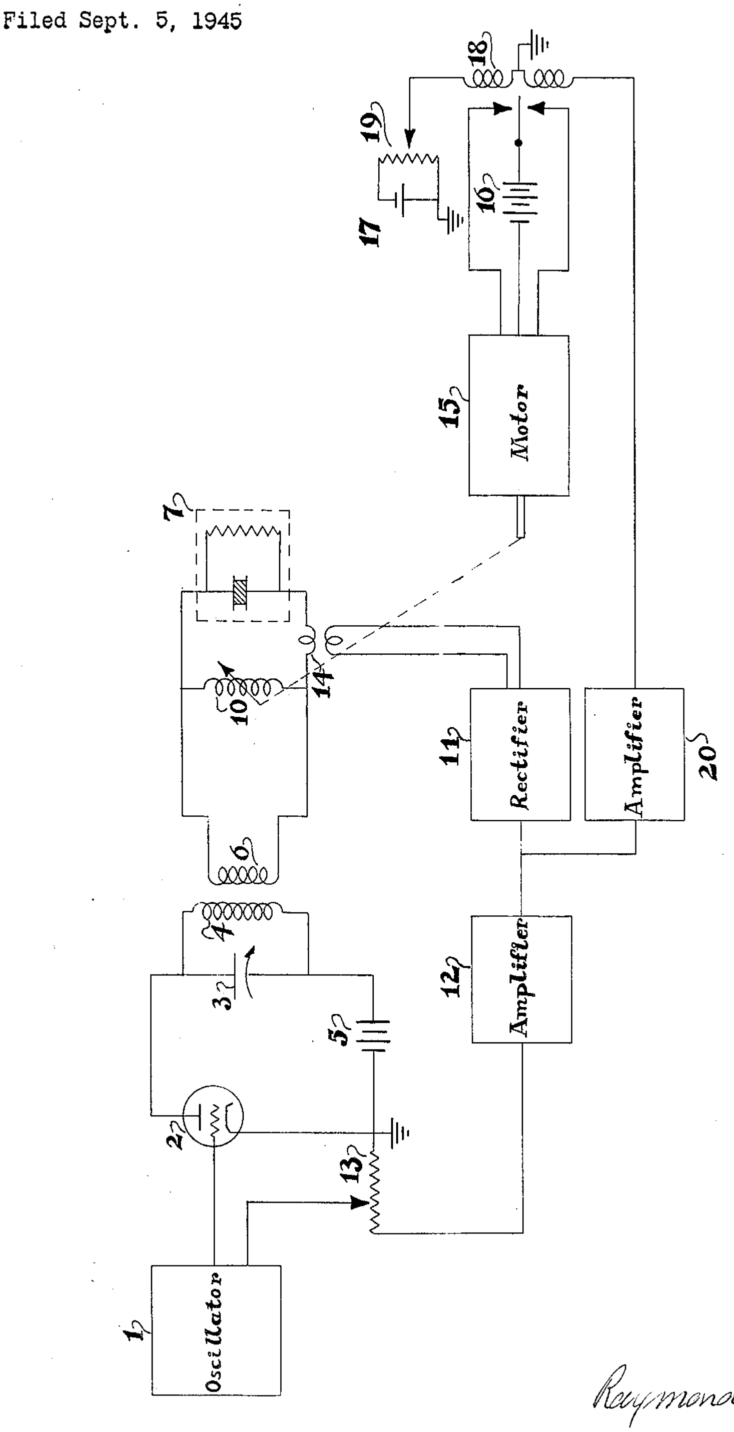
Figure 1 shows one embodiment of my invention.

Referring to Figure 1, there is shown a high frequency generator including an oscillator 1 and a power amplifier 2, having an output circuit 3, 4. The output circuit of the amplifier is coupled to a load circuit consisting of a coupling coil 6, a load 7, and a tuner 10. A plate voltage source 5 is provided which is preferably considerably in excess of the rated voltage of the amplifier. The tuner 10 may be continuously varied by a reversible motor 15. The tuner 10 has a reactance of such sign and magnitude as is required to tune the load 7 to the frequency of the generator. Coupling means 14 impresses a sample of the current through the load 7, which is also a measure of the voltage across the load, on the rectifier 11. A D. C. amplifier 12 is connected to the rectifier 11 and the output of this amplifier is used to vary one or more of the energizing voltages of the generator. For example, amplifier 12 may be connected to a potentiometer 13 which provides a bias for the power amplifier 2. The rectifier 11 and amplifier 12 will preferably include suitable limiters to prevent overloading and provide predetermined outputs. The voltage developed across the potentiometer 13 is in such a direction that the output of the amplifier 2 is increased when the load current increases. Whenever the tuning of the load circuit swings past the generator frequency causing an increase of the load current the output of the amplifier is increased. Thus the amplifier 2 runs in a quiescent state until the load circuit is conditioned to efficiently utilize its output and thereupon the output of the amplifier 2 is sharply increased. The increase may be between five-fold and several hundredfold.

Battery 17 and potentiometer 19 energize one coil of relay 18, and battery 16 then drives motor 15, and, consequently, tuner 10. Whenever the load current increases, the output of the amplifier 20 also increases and energizes another coil of relay 18. This, at first, may open relay 18 and disconnect battery 16 from the motor 15. If the load circuit approaches resonance still more closely the output of amplifier 20 will increase and cause relay 18 to reverse. The battery 16 will then cause the motor 15 to reverse and turn tuner 10 back. The tuner 10 will hunt around a position giving a predetermined load current. The amplifier 2 is operated above its rated plate voltage so that an inexpensive power tube can be used to produce sufficiently high levels of power during the moments when the load circuit is in resonance with the oscillator frequency without exceeding the average power rating of the tube.

Figure 2:
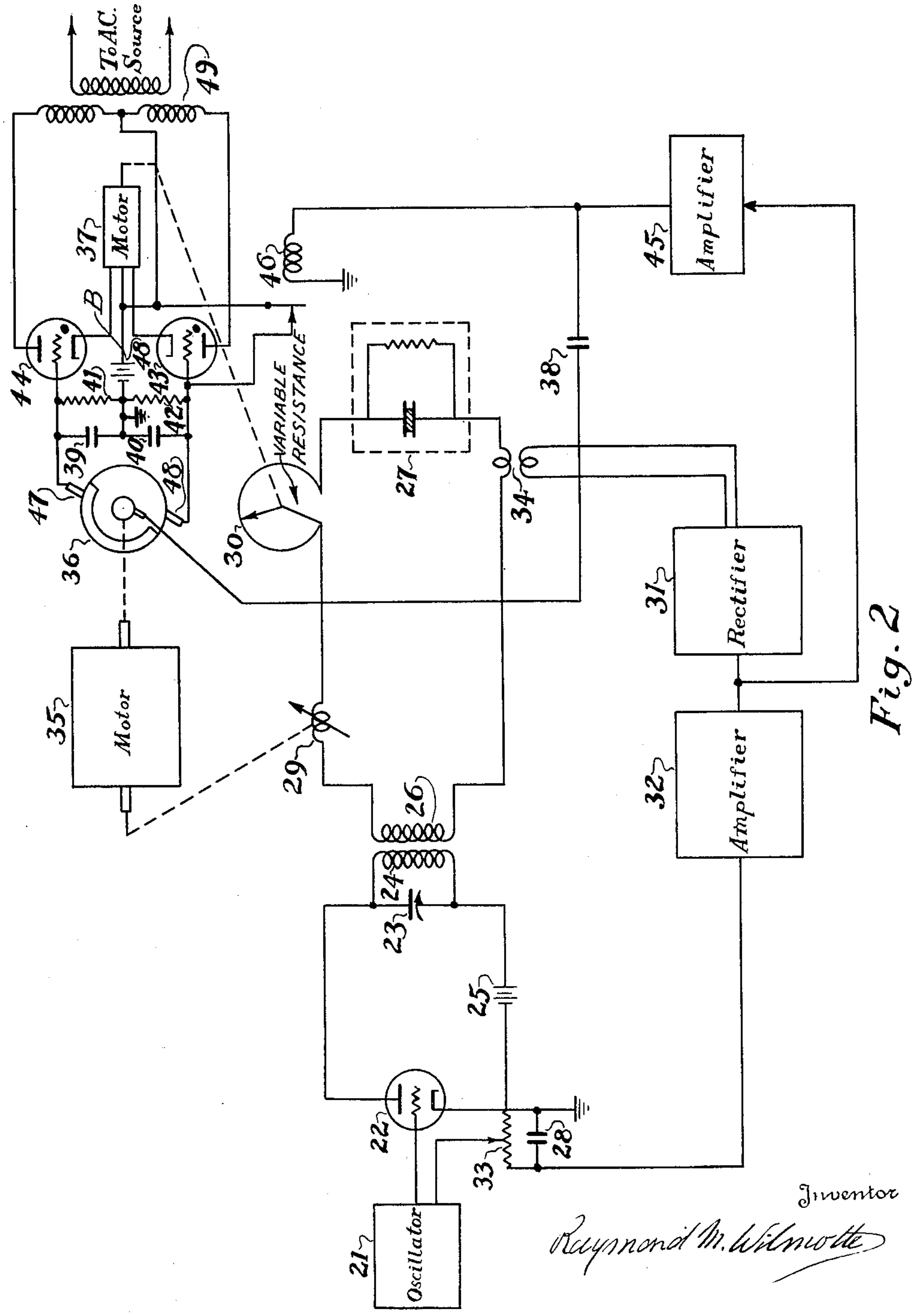
Figure 2 shows another embodiment of the invention, including apparatus for continuously monitoring the load circuit tuning.

Reference is now made to Figure 2 showing an oscillator 21 and a power amplifier 22 having an output circuit 23, 24, a source of plate voltage 25 and a biasing potentiometer 33. The voltage source 25 is preferably considerably in excess of the rated plate voltage of the power amplifier tube. A load circuit consisting of a coupling coil 26, tuning elements 29 and 30, and a load 27 is coupled to the output circuit of the power amplifier. In the same manner as in Figure 1, a voltage proportional to the load circuit current is derived by a transformer 34 and impressed on a limited output rectifier 31 and amplifier 32 to provide a biasing potential across the potentiometer 33 to increase the output of the power amplifier when the load circuit current increases. The tuning element 29, which is capable of swinging the resonant frequency of the load circuit through a narrow range, is continuously rotated by a motor 35. The tuner 30 is rotated by a motor 37 controlled by gaseous tubes 44 and 43. The normally closed relay 46 causes tube 43 to drive motor 37 until the relay is opened, due to an increase in load current.

In order to permit the tuner 30 to compensate for drifts in the reactance of the load circuit, the following means are provided: the output of the amplifier 45 is fed through a condenser 38 and rotary switch 36 to the grids of tubes 43 and 44. The rotary switch 36 is synchronized with tuning element 29 so that the output of the switch 36 is fed to the brush 47, for example, when the tuner 29 is increased above the average value of the reactance and is fed to the brush 48, when the tuner 29 is decreased below the average value of the reactance.

The condensers 39 and 40 and resistors 41 and 42 hold the charges on the grids of tubes 43 and 44 for about half the period of a cycle of the A. C. source energizing the plate circuits of these tubes. Battery B normally biases tubes 43 and 44 to cutoff. The plate voltage for tubes 43 and 44 is supplied by transformer 49.

The time constant of the biasing potential impressed on the control grid of amplifier 22 may be made large enough to permit peak output of the amplifier throughout a substantial portion of a cycle of the tuner 29. For this purpose a bypass condenser 28 and additional time constant increasing elements in the amplifier 32 may be provided. If desired, the time constant can be made long enough to permit peak output of the amplifier 22 to occur continuously when the tuner 29 is swinging the tuning of the load circuit past the generator frequency.

Figures 3, 4:
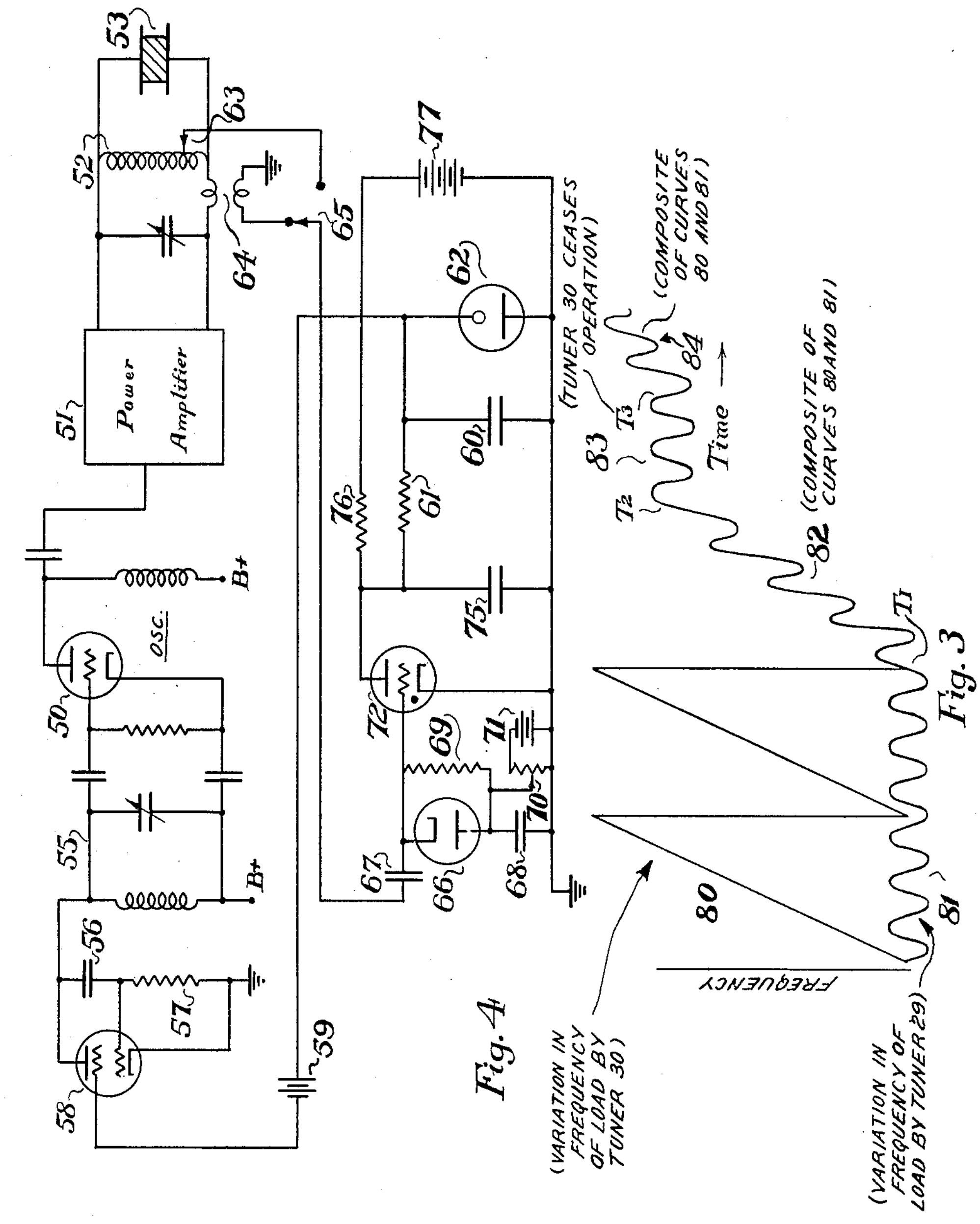
Figure 3 is a schematic circuit diagram illustrating the operation of the circuits disclosed in Figures 1 and 2.
Figure 4 shows an electronic control circuit for maintaining a predetermined load current or load voltage.

The operation of the circuit shown in Figures 1 and 2 may be more clearly understood in connection with Figure 3. In this figure the curve 80 represents the variation in resonant frequency of the load circuit produced by tuner 30 only while the curve 81 represents the variations in load circuit resonant frequency produced by the tuner 29 only. If at a given time $T_1$ the tuners 29 and 30 are in operation the resonant frequency of the load circuit will vary in accordance with the curve 82 until the frequency of the generator is intercepted at some time $T_2$, for example. At such time the relay 46 of Figure 2 is operated to stop the tuner 30. Thereafter the frequency of the load circuit in Figure 2 will be varied by the tuner 29 in accordance with the curve 83. If at any time the load circuit tuning should depart from the generator frequency so that the tuner 29 no longer swings through the generator frequency the relay 46 would again close and cause the tuner 30 to shift the frequency in accordance with the curve 80 to again find the generator frequency. However, in the circuit shown in Figure 2 the tuner 30 is made to track the generator frequency to compensate for drifts in the reactance of the load so as to maintain the load circuit substantially tuned to the generator frequency. If at a time $T_3$ the generator frequency should drift, the tuner 30 would be adjusted so that the resonant frequency of the load circuit would follow the curve 84.

Reference is now made to Figure 4 which shows an electronic control system for maintaining a predetermined load current or load voltage. The generator portion of the circuit consists of an oscillator 50, a power amplifier 51 and a load circuit 52. The power amplifier 51 may include suitable buffer and voltage amplifiers also, and the load circuit 52 is preferably the tank circuit of the power amplifier. A load 53 is closely coupled to the tank circuit and may be connected directly across the tank circuit as shown. The oscillator 50 is provided with a frequency determining circuit 55, here shown as connected between the control grid and cathode of the oscillator. Across the circuit 55 is connected a reactance tube circuit consisting of a vacuum tube 58 and phase shifting elements 56 and 57, for impressing a suitable voltage on one control grid of tube 58 in a manner known in this art. On another control electrode of tube 58 is impressed the voltage of battery 59 and that developed across condenser 60. The condenser 60, resistor 61, and gaseous tube 62 constitute a sawtooth voltage generator. The sawtooth voltage impressed on tube 58 causes the frequency of oscillator 50 to swing over a wide range until the resonant frequency of the load circuit is encountered. When the current through the load or the voltage across the load attains a predetermined value the operation of the sawtooth voltage generator is interrupted in a manner which will now be described.

The couplings 63 or 64 impress a voltage across the rectifier 66 through the switch 65 and condensers 67 and 68. The rectifier 66 develops a positive grid bias across the resistor 69. When this bias attains a voltage predetermined by the setting of potentiometer 70 the gaseous tube 72 discharges. The potentiometer 70 is connected across a suitable biasing battery 71. The breakdown of tube 72 discharges condenser 75 and thus prevents further charging of the condenser 60. The operation of this circuit should now be clear. The sawtooth voltage developed across condenser 60 enables the reactance tube 58 to swing the frequency of oscillator 50 until the resonant frequency of the load circuit 52 develops a predetermined current or voltage. When this condition is attained a positive bias is applied to tube 72, causing it to break down and discharge condenser 75 and prevent further charging of the condenser 60. The time constant of the condenser 75 and resistor 76 is made very small compared to the time required to charge condenser 60. This permits tube 72 and condenser 75 to maintain the voltage across condenser 60 substantially constant in normal operation. Moreover, this constant value will be just that which gives the predetermined current or voltage in the load circuit. By means of the switch 65 and the potentiometer 70 the operator may choose a load current which will give a desired rate of heating or a load voltage below the puncture or breakdown voltage of the load.

While the generator has been shown as consisting of an oscillator and amplifier, this is merely illustrative. If desired, only a power oscillator could be used. It is evident that amplifiers of any type and load circuits of any type may be used. The load circuits may be series tuned as in Figure 2 or parallel tuned as in Figure 1, and the tuning elements may be any type of variable reactances such as, for example, variable condensers, variable inductances or variable stub lines. The speed of the motor 35 of Figure 2 is preferably quite high, for example, 1800 R. P. M.

Many other variations of my invention within the scope of the following claims will be apparent to those skilled in the art.

I claim:

1. In combination, a high frequency generator for electronic heating, a tunable load circuit coupled with said generator and having a resonance characteristic of predetermined width, means for energizing said load circuit at substantially the frequency of said generator comprising means for periodically varying the tuning of said load circuit past the generator frequency in frequency swings at least as great as said predetermined width, and means for varying the output of said generator in response to load circuit current so that the maximum output of said generator occurs when said load circuit is substantially resonant to the frequency of said generator.

2. In combination, a high frequency generator, a tunable load circuit coupled thereto, means for varying the tuning of said load circuit over a wide range, second means for cyclically varying the tuning of said load circuit over a narrow range of frequencies wider than said band width of said load circuit, means responsive to load circuit current of a predetermined magnitude occurring only while the generator frequency falls within said band width for disabling operation of said first mentioned means, and means for increasing power output capability of said generator during periods when said second means varies the tuning of said load circuit through resonance with the frequency of said generator.

3. The combination of a high frequency generator oscillating at a first frequency, a tunable load circuit coupled thereto and having a predetermined band width, first means for tuning said load circuit over a wide range, second means for periodically varying the resonant frequency of said load circuit over a narrow range, said narrow range being wider than the said band width of said load circuit, means responsive to load circuit current for causing said first named means to bring and maintain the resonant frequency of said load circuit sufficiently close to said generator frequency to assure that said resonant frequency of said load circuit is brought into periodic coincidence with said generator frequency by said second named means.

4. The combination of a high frequency generator having a normal predetermined power output capability, a tunable load circuit coupled thereto and having a band width of predetermined extent, means for swinging the resonant frequency of said load circuit over a wide range, means for periodically swinging the resonant frequency of said load circuit over a narrow range wider than the said predetermined extent, means responsive to current flow to said load circuit for disabling operation of said first named means, means responsive to a drift in the average resonant frequency of said load circuit with respect to the frequency of said generator for compensating for said drift, and means for greatly increasing the output capability of said generator while said generator frequency falls within said band width.

5. High frequency heating apparatus including a high frequency generator, a tunable load circuit the tuning of which is normally subject to variation during a heating cycle, said tunable load circuit having a resonance characteristic of predetermined frequency range, first means for varying the tuning of said generator over a first relatively wide range greater than said predetermined frequency range, second means for cyclically varying the tuning of said generator over a relatively narrow range greater than said predetermined frequency range, and means responsive only to a load circuit current of predetermined magnitude for disabling operation of said first means for varying the tuning of said generator.

6. High frequency heating apparatus including a high frequency generator, a tuned load circuit of predetermined band width, the resonant frequency of which is subject to variation during a heating cycle, means for periodically varying the relative frequencies of said generator and of said load circuit over a range greater than said band width, and means responsive to a difference between the frequency of said generator and said resonant frequency of said load circuit for decreasing said difference between said frequency of said generator and said resonant frequency of said load circuit to a value less than said range.

7. In combination, a generator of high frequency oscillations, a load circuit comprising material to be electronically heated, means coupling said load circuit in power abstracting relation to said generator, means for periodically varying the relative tuning of said tunable load circuit and of said generator alternately into and out of substantial frequency correspondence to supply energy to said load circuit in pulses having a periodicity integrally related with the periodicity of said means for periodically varying said relative tuning.

8. In combination, a tunable generator of high frequency oscillations, a load circuit comprising materials to be electronically heated, means coupling said load circuit in power abstracting relation to said generator, means for periodically varying the tuning of said generator alternately to a frequency remote from resonance with and in resonance with the frequency of said load circuit to supply energy to said load circuit in pulses having a periodicity integrally related with the periodicity of said means for periodically varying the tuning of said generator.

9. In combination, a tunable generator of high frequency oscillations, a load circuit coupled in power abstracting relation to said generator, means for periodically varying the tuning of said generator from a first frequency selected for transferring maximum power from said generator to said load circuit to a second frequency selected for transferring substantially negligible power from said generator to said load circuit periodically to supply energy to said load circuit in pulses having a periodicity integrally related to the periodicity of said means for periodically varying the tuning of said generator.

10. In combination, a generator of high frequency oscillations, a load circuit coupled in power abstracting relation with said generator, means for periodically varying the difference of tuning of said generator and of said tunable load circuit from a first frequency difference selected for abstraction of maximum power from said generator to a second frequency difference selected for abstraction of substantially negligible power from said generator whereby to supply energy to said load circuit in pulses having a periodicity integrally related with the periodicity of said means for periodically varying the difference of tuning of said generator and of said load circuit.

11. In combination, a generator of high frequency oscillations, a tunable load circuit coupled in power abstracting relation with said generator, automatic means for tuning said generator to resonance with a frequency of said load circuit to increase current flow in said load circuit, means responsive to said increase of flow to detune said generator with respect to the frequency of said load circuit to effect a decrease of current in said load circuit, and means responsive to said decrease of current in said load circuit for retuning said generator to resonance with the frequency of said load circuit.

12. In combination, a generator of high frequency oscillations, a load circuit coupled in power abstracting relation with said generator, automatic means for establishing a condition of correspondence between the frequency of said generator and the frequency of said load circuit to increase current flow in said load circuit, means responsive to said increase in current flow in said load circuit to establish a difference of frequency between the frequency of said generator and the frequency of said load circuit whereby to effect a decrease of current in said load circuit, and means responsive to said decrease of current in said load circuit for re-establishing said condition of correspondence between the frequency of said generator and the frequency of said load circuit.

13. In combination a generator of high frequency oscillations, a load circuit coupled in power abstracting relation with said generator, automatic means for tuning said generator to resonance with the frequency of said load circuit to increase current flow in said load circuit, means responsive to said increase of current flow to detune said generator with respect to the frequency of said load circuit to effect a decrease of current to said load circuit, and means responsive to said decrease of current in said load circuit for retuning said generator to resonance with the frequency of said load circuit.

14. In combination a generator of high frequency oscillation, means for controlling power output of said generator, a load circuit coupled in power abstracting relation with said generator, means for automatically establishing frequency correspondence between said generator and said load circuit to increase current flow in said load circuit, means responsive to said increase of current flow in said load circuit for increasing the power output capability of said generator, means responsive to said increase of current flow for disestablishing said frequency correspondence between said generator and said load circuit whereby to decrease current flow in said load circuit, means responsive to said decrease of current flow in said load circuit for decreasing the power output capability of said generator, and means responsive to said decrease of said current flow in said tunable load circuit for re-establishing correspondence between the frequencies of said generator and of said load circuit.

15. In a system for establishing frequency correspondence between the frequency of a tunable generator of radio frequency oscillations and a tuned load circuit the frequency of which is subject to variation with time, the combination comprising, electronic means for varying the frequency of said generator of radio frequency oscillation in response to a control voltage applied to said electronic means, a saw-tooth voltage generator for applying control signal to said electronic means, and means operable during a cycle of said saw-tooth voltage and in response to establishment of frequency correspondence between the frequency of said generator and the frequency of said tuned circuit for disabling said saw-tooth generator.

16. In a system for establishing correspondence between the frequency of a generator of radio frequency oscillations and the resonant frequency of a tuned load circuit which is subject to variation of resonant frequencies with time comprising, a reactance tube for varying the resonant frequency of said generator, said reactance tube comprising an electronic device having a control electrode, the frequency of said generator being a function of control voltage applied to said control electrode, means for generating a periodically varying control voltage for application to said control electrode, and means responsive to establishment of correspondence between the frequency of said generator and the resonant frequency of said tuned circuit for disabling said means for generating control voltage.

17. In a system for establishing correspondence between the output frequency of a generator of radio frequency oscillations and the resonant frequency of a tuned load circuit, the combination comprising, a reactance tube coupled with said generator, said reactance tube comprising voltage responsive means for varying the output frequency of said generator, means for generating a voltage for application to said voltage responsive means comprising a saw-tooth generator for generating a continuously increasing saw-tooth voltage, and means responsive to establishment of correspondence between the frequency of said generator and the frequency of said tuned circuit for preventing further increase of said saw-tooth voltage.

18. In a system for establishing frequency correspondence between the frequency of a generator of radio frequency oscillations and the resonant frequency of a tuned load circuit for said generator, the combination comprising, a reactance device coupled with said generator for varying the frequency of said generator, said reactance device comprising an electronic device having a control electrode responsive to control voltage for controlling the reactance of said reactance device, a capacitor, means for charging said capacitor at a substantially logarithmic rate, means for coupling said control electrode with said capacitator for establishing a voltage on said control electrode which varies at said logarithmic rate, and means responsive to establishment of correspondence between the frequency of said generator and the frequency of said tuned load circuit for preventing further increase of charge on said capacitor.

19. In a system for establishing correspondence between the frequency of a generator of radio frequency oscillations and a resonant load circuit coupled to said generator, means for varying the frequency of said generator comprising an electronic discharge device having a control electrode, means responsive to voltage applied to said control electrode for varying the output frequency of said generator, a source of control voltage for said generator comprising a capacitor and a charging circuit for said capacitor, means for disabling said discharge device having a control electrode for effecting discharge of said gaseous discharge device, and means responsive to said discharge of said gaseous discharge device for disabling said charging circuit.

20. In combination, a generator of high frequency oscillations, a tunable load circuit comprising material to be electronically heated, means coupling said load circuit in power abstracting relation with said generator, means for periodically varying the tuning of said tunable load circuit alternately out of resonance with and into resonance with the frequency of said generator, said variations of tuning having values adapted to supply energy to said load circuit in pulses having a periodicity integrally related with the periodicity of said means for periodically varying the tuning of said tunable load circuit.

21. In combination, a generator of high frequency oscillations having a normal rated power output, means for controlling the power output of said generator, a tunable load circuit coupled in power abstracting relation with said generator, means for periodically varying the tuning of said tunable load circuit from and to a frequency resonant with the frequency of said generator to supply energy to said load circuit in pulses having a periodicity integrally related with the periodicity of said means for periodically varying the tuning of said tunable load circuit, and means for increasing the power output of said generator to a value above said rated power output during said pulses and for decreasing the power output of said generator to a value below said rated output in periods between said pulses.

22. In combination, a generator of high frequency oscillations normally oscillating in a quiescent state, means for increasing the power output of said generator, a tunable load circuit coupled in power abstracting relation with said generator, means for periodically varying the tuning of said tunable load circuit from and to a frequency resonant with the frequency of said generator to supply energy to said load circuit in pulses having a periodicity integrally related with the periodicity of said means for periodically varying the tuning of said tunable load circuit, and means for increasing the power output of said generator only during said pulses and for maintaining said generator in said quiescent state in the periods between said pulses.

23. In combination, a generator of high frequency oscillations, means for controlling the power output of said generator, a load circuit coupled in power abstracting relation with said generator, means for periodically varying the relative tuning of said generator and said tunable load circuit from and to a condition of frequency correspondence to supply energy to said load circuit in pulses having a periodicity integrally related with the periodicity of said means for periodically varying said tuning, and means for increasing the power output capability of said generator during said pulses and for decreasing the power output capability of said generator in periods between said pulses.

24. In combination, a generator of high frequency oscillations, a tunable load circuit coupled in power abstracting relation with said generator, means for periodically varying the tuning of said tunable load circuit from a first frequency selected for abstraction of maximum power from said generator by said load circuit to a second frequency selected for abstraction by said load circuit of substantially negligible power from said generator, whereby to supply energy to said load circuit in pulses having a periodicity integrally related with the periodicity of said means for periodically varying the tuning of said tunable load circuit.

25. In combination, a generator of high frequency oscillations, means for controlling the power output of said generator, a tunable load circuit coupled in power abstracting relation with said generator, means for periodically varying the tuning of said tunable load circuit from a first frequency adapted for maximum transfer of energy between said generator and said load circuit to a second frequency adapted for substantially negligible transfer of energy between said generator and said load circuit to supply energy to said load circuit in pulses having a periodicity integrally related with the periodicity of said means for periodically varying the tuning of said tunable load circuit, and means for increasing the power output capability of said generator during said pulses and for decreasing the power output capability of said generator in periods between said pulses.

26. In combination, a generator of high frequency oscillations, means for controlling power output of said generator, a tunable load circuit coupled in power abstracting relation with said generator, means for periodically varying the tuning of said tunable load circuit out of resonance with and into resonance with the frequency of said generator, to supply energy to said load circuit in pulses having a periodicity integrally related with the periodicity of said means for periodically varying the tuning of said tunable load circuit, and means responsive to said pulses for actuating said means for controlling power output of said generator to increase said power output during said pulses only.

27. In combination, a generator of high frequency oscillations, a tunable load circuit coupled in power abstracting relation with said generator, automatic means for tuning said load circuit to resonance with the frequency of said generator to increase current flow in said load circuit, means responsive to said increase of current flow to detune said load circuit with respect to the frequency of said generator to effect a decrease of current in said load circuit, and means responsive to said decrease of current in said load circuit for retuning said load circuit to resonance with the frequency of said generator.

28. In combination, a generator of high frequency oscillations, means for controlling power output of said generator, a tunable load circuit coupled in power abstracting relation with said generator, means for automatically tuning said load circuit to resonance with the frequency of said generator to increase current flow in said load circuit, means responsive to increase of current flow in said tunable load circuit for increasing the power output capability of said generator, means responsive to said increase of current flow for detuning said tunable load circuit from resonance with the frequency of said generator to decrease current flow to said load circuit, means responsive to decrease of current flow in said tunable load circuit for decreasing the power output capability of said generator, and means responsive to decrease of said current flow in said tunable load circuit for retuning said tunable load circuit to resonance with the frequency of said generator.

29. In combination, a generator of high frequency oscillations, means for varying the tuning of said tunable load circuit, means comprising a motor for actuating said means for tuning said tunable load circuit, motor control means for controlling said motor for actuating said tuning means in a first direction to establish resonance of said tunable load circuit with the frequency of said generator, means responsive to establishment of said resonant condition for reversing said motor, and means responsive to dis-establishment of said condition of resonance for again reversing said motor.

30. In combination, a generator of high frequency oscillations, means for controlling power output of said generator, a tunable load circuit having a resonance characteristic of predetermined width coupled in power abstracting relation with said generator, means for periodically varying the tuning of said tunable load circuit over a frequency range greater than said predetermined width, further means for varying the tuning of said tunable load circuit over a band of frequencies more than twice said first mentioned predetermined width, and means responsive to establishment of a condition of resonance of said tunable load circuit with the frequency of said generator for disabling said last named tuning means.

31. In combination, a generator of high frequency oscillations, a tunable load circuit having a predetermined total tuning range and a predetermined band width and coupled in power abstracting relation with said generator, means for tuning said tunable load circuit over said tuning range at a first predetermined rate of tuning, means for periodically varying the tuning of said tunable load circuit over only a portion of said tuning range greater than said predetermined band width at a substantially higher rate of tuning, and means responsive to establishment of a condition of resonance of said tunable load circuit with the frequency of said generator during said tunings for disabling only said first named tuning means.

32. In combination, a generator of high frequency oscillations, means for controlling power output of said generator, a tunable load circuit coupled in power abstracting relation with said generator, means for periodically varying the tuning of said tunable load circuit from and to a frequency resonant with the frequency of said generator, to supply energy to said load circuit in pulses having a periodicity integrally related with the periodicity of said means for periodically varying the tuning of said tunable load circuit, and means for increasing the power output capabilities of said generator during said pulses and for decreasing the power output capabilities of said generator in periods between said pulses.

RAYMOND M. WILMOTTE.

REFERENCES CITED

The following references are of record in the file of this patent:

UNITED STATES PATENTS

| Number | Name | Date |
| --- | --- | --- |
| 2,318,061 | Dailey | May 4, 1943 |
| 2,376,667 | Cunningham et al. | May 22, 1945 |
| 2,381,496 | Hansell | Aug. 7, 1945 |
| 2,391,085 | Crandell | Dec. 18, 1945 |
| 2,396,004 | Gilbert | Mar. 5, 1946 |
| 2,401,424 | Hershberger | June 4, 1946 |
| 2,415,799 | Reifel | Feb. 11, 1947 |